US012648160B2

(12) United States Patent
Chen et al.

(10) Patent No.: US 12,648,160 B2
(45) Date of Patent: Jun. 2, 2026

(54) SEMICONDUCTOR DEVICE STRUCTURE WITH MAGNETIC STRUCTURE AND METHOD FOR FORMING THE SAME

(71) Applicant: Taiwan Semiconductor Manufacturing Company, Ltd., Hsinchu (TW)

(72) Inventors: Wei-Chung Chen, Hsinchu City (TW); Jun-Yi Wu, Miaoli County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 390 days.

(21) Appl. No.: 18/512,281

(22) Filed: Nov. 17, 2023

(65) Prior Publication Data
US 2025/0169084 A1 May 22, 2025

(51) Int. Cl.
H10D 1/20 (2025.01)

(52) U.S. Cl.
CPC ..................................... H10D 1/20 (2025.01)

(58) Field of Classification Search
CPC ........................................................ H10D 1/20
See application file for complete search history.

(56) References Cited

U.S. PATENT DOCUMENTS

| | | | | |
|---|---|---|---|---|
| 10,164,001 B1 * | 12/2018 | Lee | ..................... | H01L 23/3171 |
| 10,868,106 B2 * | 12/2020 | Huang | .............. | H01L 21/32134 |
| 11,784,211 B2 * | 10/2023 | Hsu | .......................... | H10D 1/20 |
| | | | | 257/531 |
| 2016/0308112 A1 * | 10/2016 | Tan | ........................... | C23F 4/00 |
| 2017/0229532 A1 * | 8/2017 | Chen | ........................ | H10D 1/20 |
| 2019/0164584 A1 * | 5/2019 | Chuang | .................. | H10N 50/85 |
| 2020/0006465 A1 * | 1/2020 | Ku | ............................ | H10D 1/20 |
| 2020/0075448 A1 * | 3/2020 | Chen | ........................ | H10D 1/20 |
| 2020/0144182 A1 * | 5/2020 | Davis | ..................... | H10B 41/50 |
| 2023/0290809 A1 * | 9/2023 | Lee | ........................... | H10D 1/20 |

* cited by examiner

*Primary Examiner* — Bac H Au
(74) *Attorney, Agent, or Firm* — McClure, Qualey & Rodack, LLP

(57) ABSTRACT

A method for forming a semiconductor device structure is provided. The method includes providing a substrate. The method includes performing a first degas process on the substrate. The method includes forming a first magnetic layer over the substrate. The method includes forming a second magnetic layer on the first magnetic layer. The method includes performing a second degas process on the substrate, the first magnetic layer, and the second magnetic layer. The method includes forming a third magnetic layer on the second magnetic layer after the second degas process is performed. The method includes partially removing the first magnetic layer, the second magnetic layer, and the third magnetic layer.

20 Claims, 17 Drawing Sheets

SEMICONDUCTOR DEVICE STRUCTURE WITH MAGNETIC STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

The semiconductor industry continues to improve the integration density of various electronic components (e.g., transistors, inductors, diodes, resistors, capacitors, etc.) by continual reductions in minimum feature size, which allow more components to be integrated into a given area.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 is an enlarged view of a first region of the semiconductor device structure of FIG. 1A, in accordance with some embodiments.

FIG. 1A-2 is an enlarged view of a second region of the semiconductor device structure of FIG. 1A-1, in accordance with some embodiments.

FIG. 1C-1 is an enlarged view of a region of the semiconductor device structure of FIG. 1C, in accordance with some embodiments.

FIG. 1C-2 is an enlarged top view of the region of the semiconductor device structure of FIG. 1C, in accordance with some embodiments.

FIG. 1G-1 is an enlarged view of a first region of the semiconductor device structure of FIG. 1G, in accordance with some embodiments.

FIG. 1G-2 is an enlarged view of a second region of the semiconductor device structure of FIG. 1G-1, in accordance with some embodiments.

FIG. 1H-1 is an enlarged view of a region of the semiconductor device structure of FIG. 1H, in accordance with some embodiments.

FIG. 1H-2 is an enlarged top view of the region of the semiconductor device structure of FIG. 1H, in accordance with some embodiments.

DETAILED DESCRIPTION

Figure 1A:
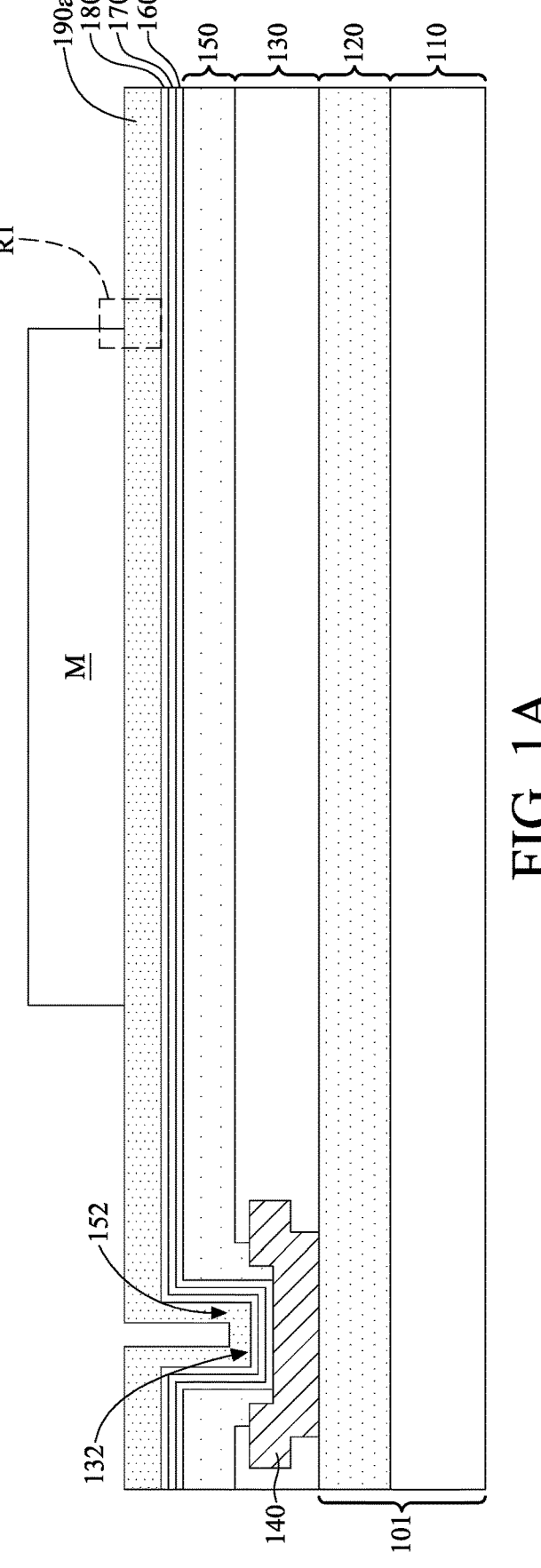
FIGS. 1A-1I are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1I are cross-sectional views of various stages of a process for forming a semiconductor device structure, in accordance with some embodiments. As shown in FIG. 1A, a substrate 101 is provided, in accordance with some embodiments. The substrate 101 includes a semiconductor substrate 110, devices, and an interconnect structure 120 over the semiconductor substrate 110 and the devices, in accordance with some embodiments. The devices are not shown in figures for the purpose of simplicity and clarity.

The semiconductor substrate 110 is made of an elementary semiconductor material including silicon or germanium in a single crystal structure, a polycrystal structure, or an amorphous structure. In some other embodiments, the semiconductor substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The semiconductor substrate 110 may also include multi-layer semiconductors, semiconductor on insulator (SOI) (such as silicon on insulator or germanium on insulator), or a combination thereof.

In some embodiments, the devices are formed in and/or over the semiconductor substrate 110. Examples of the devices include active devices, passive devices, other suitable elements, or a combination thereof. The active devices may include transistors or diodes formed at a surface of the semiconductor substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the semiconductor substrate 110. The isolation features are used to define active regions and electrically isolate various devices formed in and/or over the semiconductor substrate 110 in the active regions. In some embodiments, the isolation features include shallow trench isolation (STI) features, local oxidation of silicon (LOCOS) features, other suitable isolation features, or a combination thereof.

The interconnect structure 120 is formed over the devices and the semiconductor substrate 110, in accordance with some embodiments. The interconnect structure 120 includes a dielectric layer, wiring layers, and conductive vias, in accordance with some embodiments. The wiring layers and the conductive vias are in the dielectric layer, in accordance with some embodiments. The conductive vias are electrically connected between the wiring layers and the devices, in accordance with some embodiments.

The dielectric layer is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments. Alternatively, the dielectric layer includes a low-k material or a porous dielectric material having a k-value which is lower than that of silicon oxide, or lower than about 3.0 or about 2.5, in accordance with some embodiments.

The wiring layers and the conductive vias are made of a conductive material, such as metal (e.g., copper, aluminum, gold, silver, or tungsten) or alloys thereof, in accordance with some embodiments.

As shown in FIG. 1A, a dielectric layer 130 and a conductive pad 140 are formed over the interconnect structure 120, in accordance with some embodiments. The conductive pad 140 is embedded in the dielectric layer 130, in accordance with some embodiments. The dielectric layer 130 has an opening 132, in accordance with some embodiments.

The opening 132 exposes a central portion of the conductive pad 140, in accordance with some embodiments. The conductive pad 140 is electrically connected to the wiring layers and the conductive vias of the interconnect structure 120, in accordance with some embodiments.

The dielectric layer 130 is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments. Alternatively, the dielectric layer 130 includes a low-k material or a porous dielectric material having a k-value which is lower than that of silicon oxide, or lower than about 3.0 or about 2.5, in accordance with some embodiments.

The conductive pad 140 is made of a conductive material, such as metal (e.g., aluminum, copper, gold, silver, or tungsten) or alloys thereof, in accordance with some embodiments.

As shown in FIG. 1A, a passivation layer 150 is formed over the dielectric layer 130 and the conductive pad 140, in accordance with some embodiments. The passivation layer 150 has an opening 152, in accordance with some embodiments. The opening 152 exposes the central portion of the conductive pad 140, in accordance with some embodiments.

The passivation layer 150 is made of a polymer material, in accordance with some embodiments. The polymer material includes, for example, polyimide, plastic materials, epoxy resin, polyethylene terephthalate (PET), polyvinyl chloride (PVC), polymethylmethacrylate (PMMA), or combinations thereof.

As shown in FIG. 1A, an adhesive layer 160 is formed over the passivation layer 150 and the conductive pad 140, in accordance with some embodiments. The adhesive layer 160 is made of a metal material such as Ti, in accordance with some embodiments.

As shown in FIG. 1A, a buffer layer 170 is formed over the adhesive layer 160, in accordance with some embodiments. The buffer layer 170 is made of a nitride-containing material such as silicon nitride, in accordance with some embodiments.

As shown in FIG. 1A, an etch stop layer 180 is formed over the buffer layer 170, in accordance with some embodiments. The etch stop layer 180 is made of metal and metal oxide such as Ta and TaO, in accordance with some embodiments. The etch stop layer 180 includes metal layers (e.g., Ta layers) and metal oxide layers (e.g., TaO layers) alternatively stacked with each other, in accordance with some embodiments.

Thereafter, as shown in FIG. 1A, a degas process is performed on the substrate 101, the adhesive layer 160, the buffer layer 170, and the etch stop layer 180 to remove moisture from the substrate 101, the adhesive layer 160, the buffer layer 170, and the etch stop layer 180, in accordance with some embodiments. The degas process is performed in a vacuum atmosphere under a temperature ranging from about 110 degree C. to about 150 degree C., in accordance with some embodiments.

Figures 1, 1A:
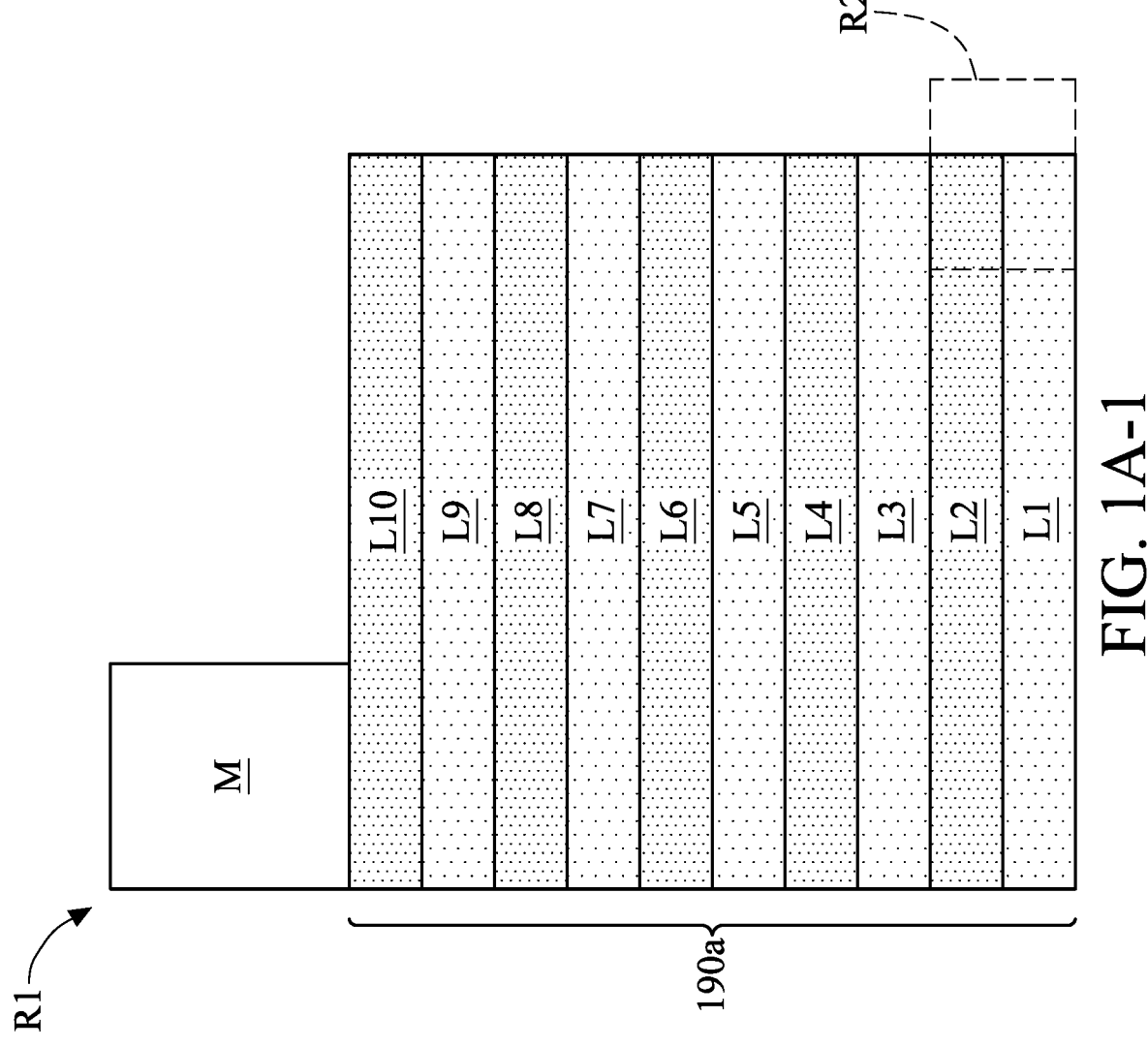

Afterwards, as shown in FIG. 1A, a magnetic film 190a is formed over the etch stop layer 180, in accordance with some embodiments. FIG. 1A-1 is an enlarged view of a first region R1 of the semiconductor device structure of FIG. 1A, in accordance with some embodiments.

As shown in FIGS. 1A and 1A-1, the magnetic film 190a includes magnetic layers L1, L2, L3, L4, L5, L6, L7, L8, L9, and L10, in accordance with some embodiments. The magnetic layers L1, L2, L3, L4, L5, L6, L7, L8, L9, and L10 are sequentially stacked over the etch stop layer 180, in accordance with some embodiments. In some embodiments, the number of the magnetic layers of the magnetic film 190a ranges from 2 to 20.

The formation of the magnetic film 190a includes: forming the magnetic layer L1 over the etch stop layer 180; forming the magnetic layer L2 over the magnetic layer L1; performing a degas process on the magnetic layers L1 and L2; forming the magnetic layer L3 over the magnetic layer L2; forming the magnetic layer L4 over the magnetic layer L3; performing a degas process on the magnetic layers L1, L2, L3, and L4; forming the magnetic layer L5 over the magnetic layer L4; forming the magnetic layer L6 over the magnetic layer L5; performing a degas process on the magnetic layers L1, L2, L3, L4, L5, and L6; forming the magnetic layer L7 over the magnetic layer L6; forming the magnetic layer L8 over the magnetic layer L7; performing a degas process on the magnetic layers L1, L2, L3, L4, L5, L6, L7, and L8; forming the magnetic layer L9 over the magnetic layer L8; and forming the magnetic layer L10 over the magnetic layer L9, in accordance with some embodiments.

The degas processes are performed in a vacuum atmosphere under a temperature ranging from about 110 degree C. to about 150 degree C., in accordance with some embodiments. If the temperature is lower than 110 degree C., the degas effect is poor, in accordance with some embodiments. If the temperature is higher than 150 degree C., the devices formed in and/or over the semiconductor substrate 110 are damaged, in accordance with some embodiments.

The magnetic layer L2 is in direct contact with the magnetic layers L1 and L3, in accordance with some embodiments. The magnetic layer L4 is in direct contact with the magnetic layers L3 and L5, in accordance with some embodiments. The magnetic layer L6 is in direct contact with the magnetic layers L5 and L7, in accordance with some embodiments.

The magnetic layer L8 is in direct contact with the magnetic layers L7 and L9, in accordance with some embodiments. The magnetic layer L10 is in direct contact with the magnetic layer L9, in accordance with some embodiments.

Figures 1, 1A, 2:
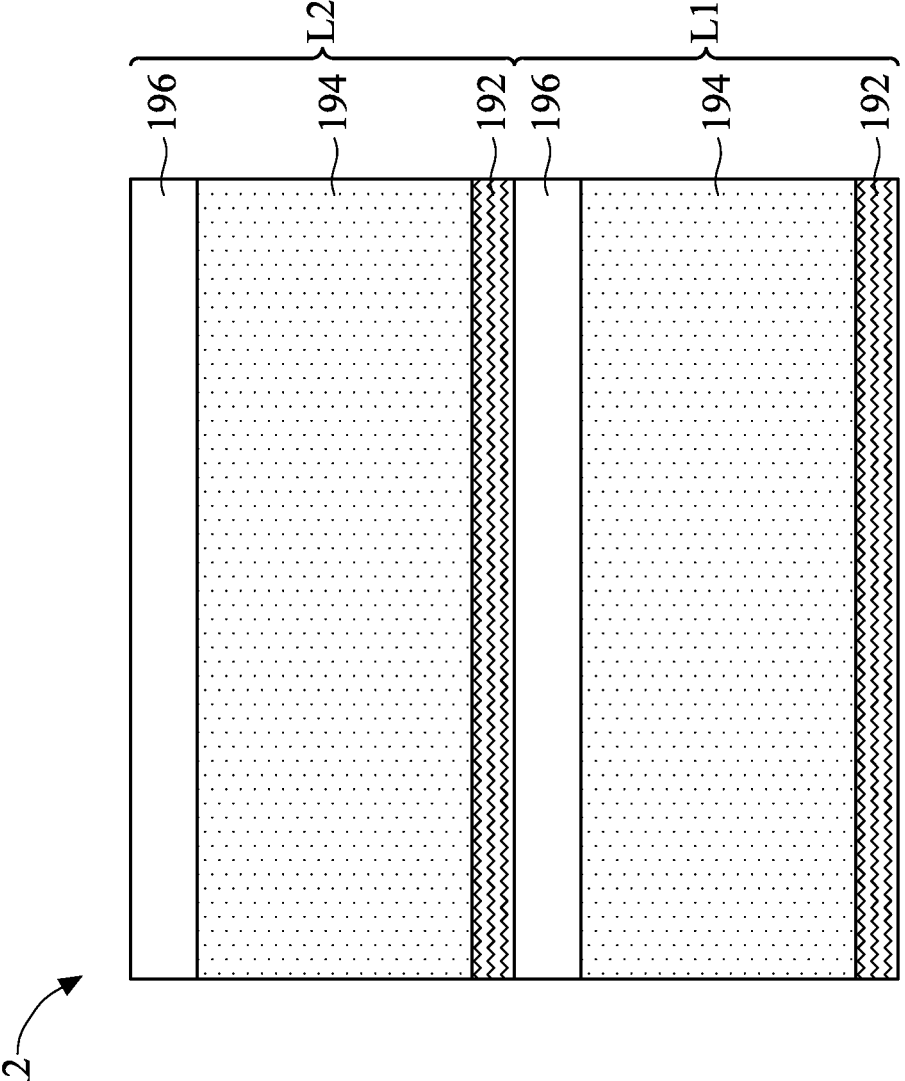

The magnetic layers L1, L2, L3, L4, L5, L6, L7, L8, L9, and L10 have the same or similar structure, in accordance with some embodiments. FIG. 1A-2 is an enlarged view of a second region R2 of the semiconductor device structure of FIG. 1A-1, in accordance with some embodiments.

As shown in FIGS. 1A-1 and 1A-2, each of the magnetic layers L1, L2, L3, L4, L5, L6, L7, L8, L9, and L10 includes a buffer layer 192, a magnetic material layer 194, and an insulating layer 196, in accordance with some embodiments. For the purpose of simplicity and clarity, FIG. 1A-2 only shows the magnetic layers L1 and L2, in accordance with some embodiments.

In each of the magnetic layers L1, L2, L3, L4, L5, L6, L7, L8, L9, and L10, the magnetic material layer 194 is formed over the buffer layer 192, and the insulating layer 196 is formed over the magnetic material layer 194, in accordance with some embodiments.

The buffer layer 192 is softer than the insulating layer 196, in accordance with some embodiments. The buffer layer 192 is used to prevent the adjacent insulating layer 196 from cracking, in accordance with some embodiments. The insulating layer 196 is used to insulate two adjacent magnetic material layers 194, in accordance with some embodiments.

The formation of each of the magnetic layers L1, L2, L3, L4, L5, L6, L7, L8, L9, and L10 includes: forming the buffer layer 192; forming the magnetic material layer 194 over the buffer layer 192; and forming the insulating layer 196 over the magnetic material layer 194, in accordance with some embodiments.

The buffer layer 192 is made of a material softer than the insulating layer 196, and the material includes metal such as Ta, in accordance with some embodiments. The buffer layer 192 is formed using a deposition process such as a physical vapor deposition (PVD) process, in accordance with some embodiments.

The magnetic material layer 194 is made of a magnetic material such as CoZrTa (CZT), in accordance with some embodiments. The magnetic material layer 194 is formed using a deposition process such as a physical vapor deposition process, in accordance with some embodiments.

The insulating layer 196 is made of an insulating material such as an oxide-containing material (e.g., oxidized CoZrTa (OCZT)), in accordance with some embodiments. The insulating layer 196 is formed using a deposition process such as a physical vapor deposition process or a chemical vapor deposition process, in accordance with some embodiments.

As shown in FIG. 1A, a mask layer M is formed over the magnetic film 190a, in accordance with some embodiments. The mask layer M is made of a polymer material such as a photoresist material, in accordance with some embodiments.

Figure 1B:
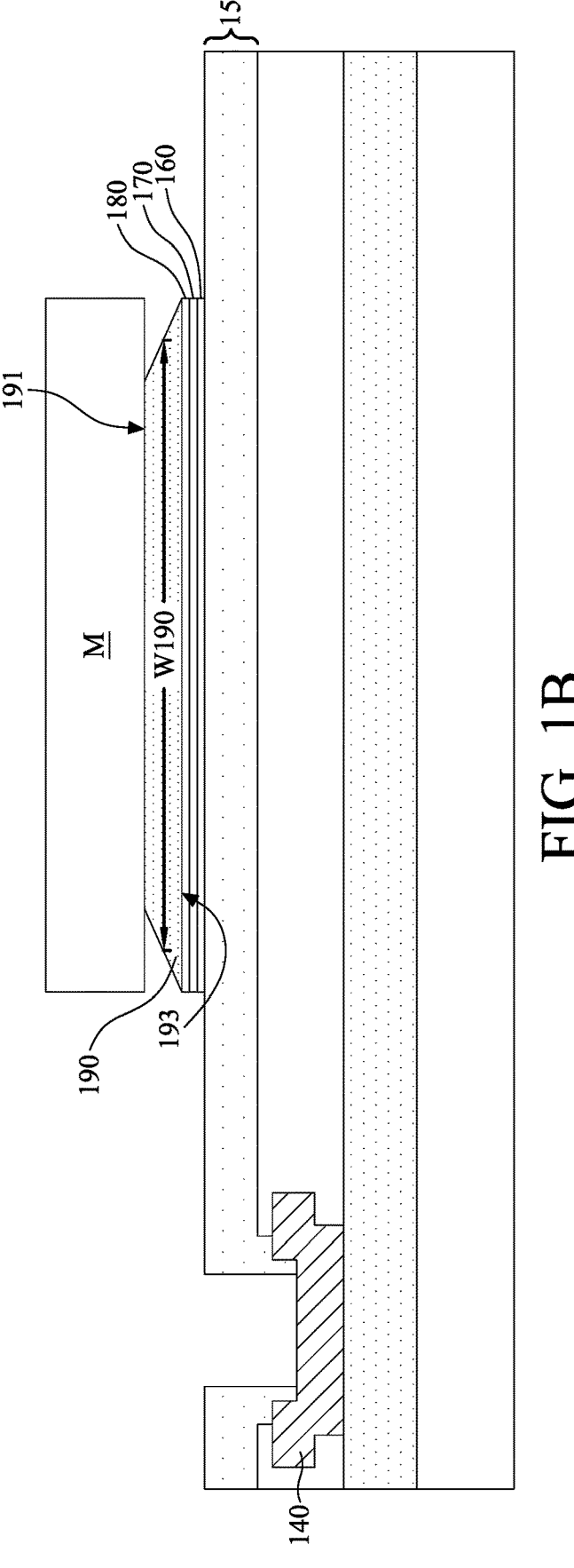

As shown in FIG. 1B, portions of the adhesive layer 160, the buffer layer 170, the etch stop layer 180, and the magnetic film 190a, which are not covered by the mask layer M, are removed, in accordance with some embodiments. The remaining magnetic film 190a forms a magnetic structure 190, in accordance with some embodiments.

The removal process includes an etching process such as a wet etching process and/or a dry etching process, in accordance with some embodiments. The etching process includes a chemical etching process, in accordance with some embodiments. The etchant of the chemical etching process includes HF and $HNO_3$, in accordance with some embodiments.

The magnetic structure 190 has a top surface 191 and a bottom surface 193, in accordance with some embodiments. Since the upper portion of the magnetic structure 190 is exposed to the etching process for a relatively longer time than the lower portion of the magnetic structure 190, a width W190 of the magnetic structure 190 gradually increases from the top surface 191 to the bottom surface 193, in accordance with some embodiments.

Figure 1C:
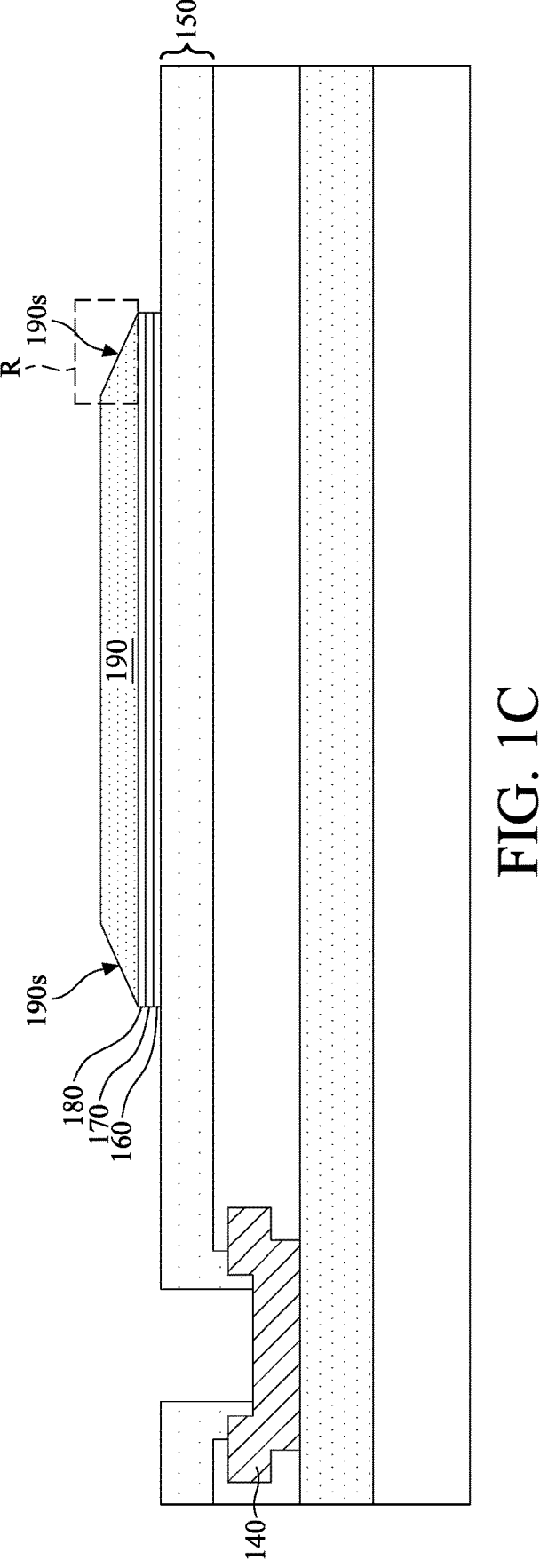
Figures 1, 1C:
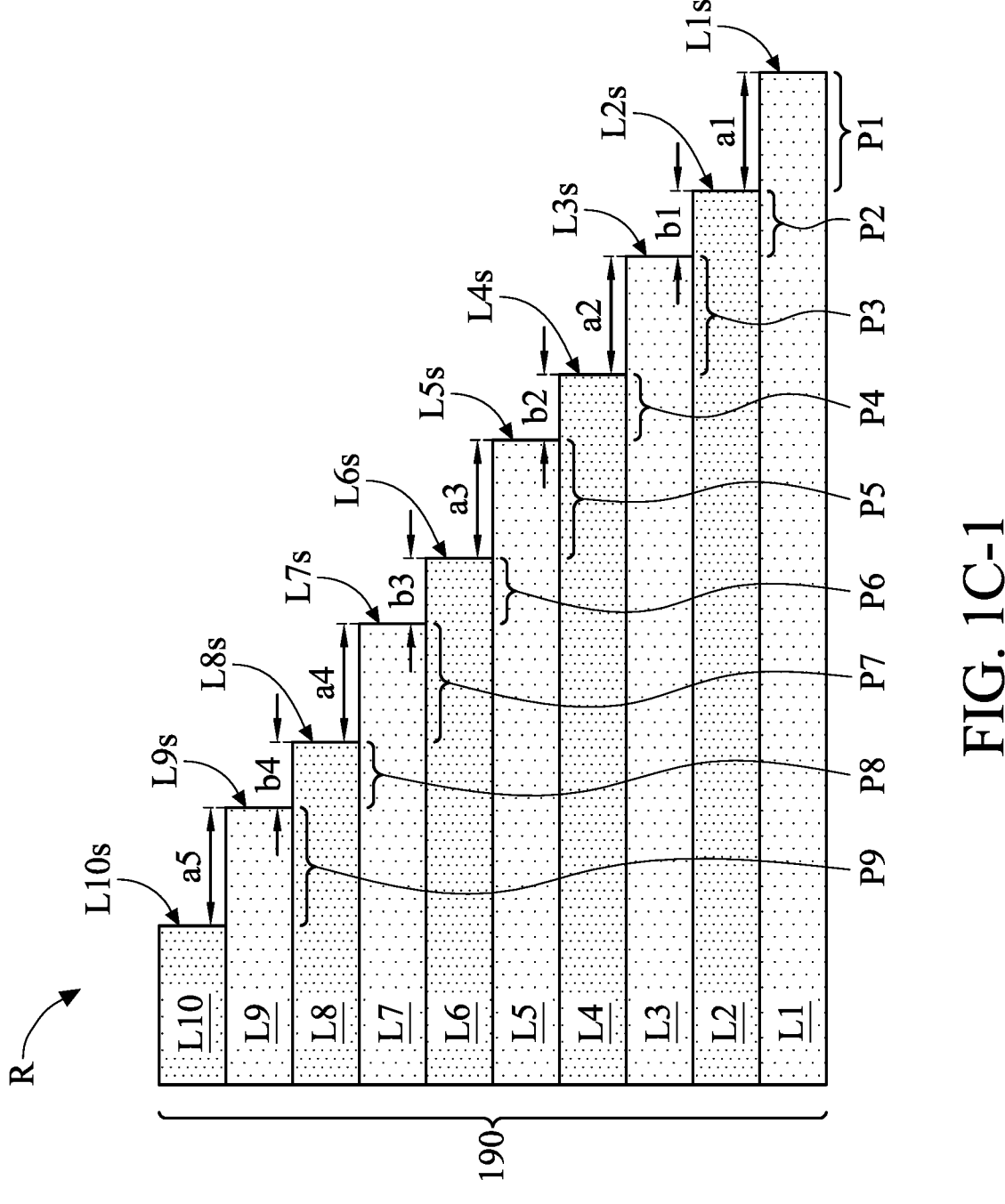
Figures 1, 1C, 2:
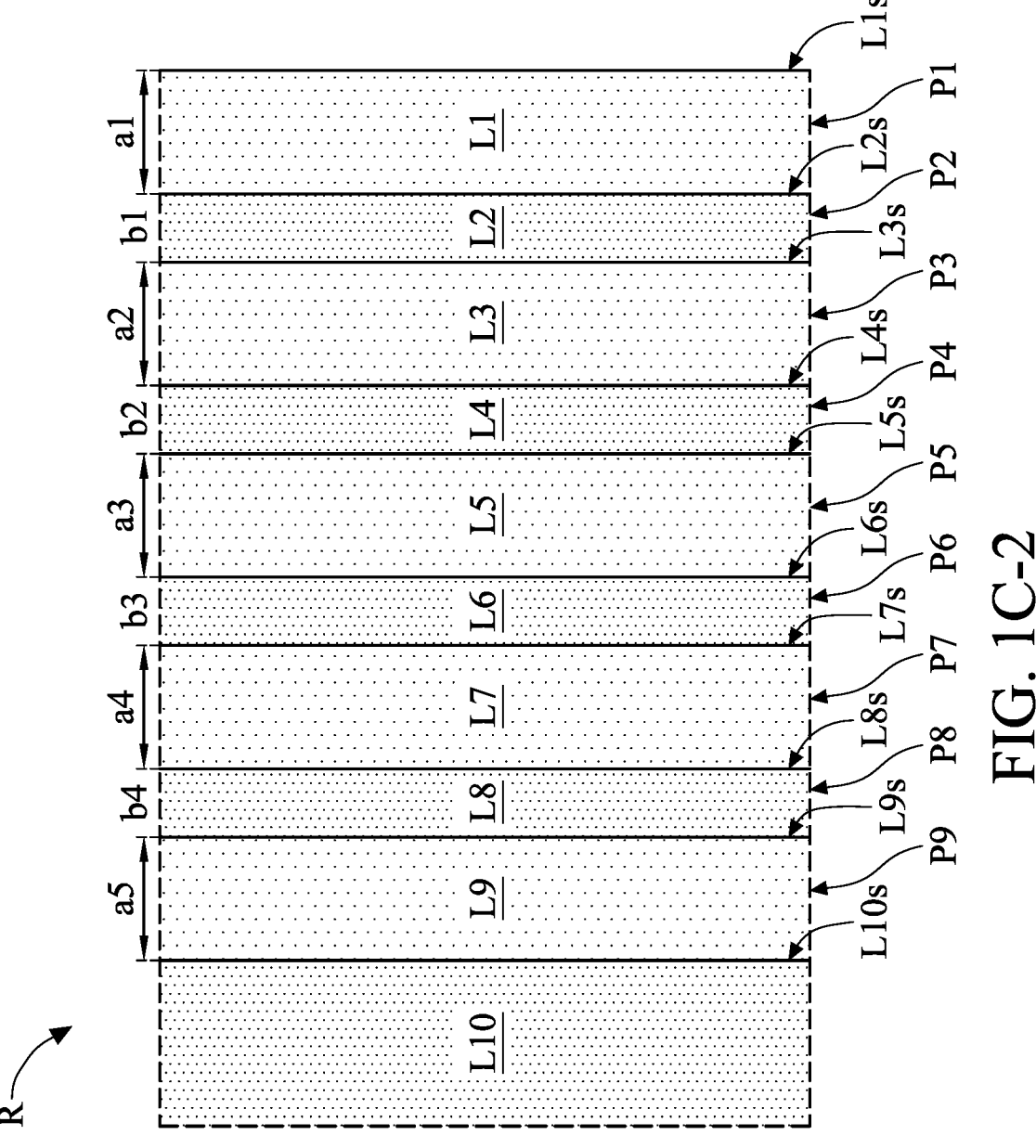

As shown in FIG. 1C, the mask layer M is removed, in accordance with some embodiments. FIG. 1C-1 is an enlarged view of a region R of the semiconductor device structure of FIG. 1C, in accordance with some embodiments. As shown in FIGS. 1C and 1C-1, the magnetic structure 190 has ladder sidewalls 190s, in accordance with some embodiments.

As shown in FIGS. 1C and 1C-1, a peripheral portion P1 of the magnetic layer L1 is exposed by the magnetic layer L2, in accordance with some embodiments. As shown in FIG. 1C-1, a peripheral portion P2 of the magnetic layer L2 is exposed by the magnetic layer L3, in accordance with some embodiments. In some embodiments, a width a1 of the peripheral portion P1 is greater than a width b1 of the peripheral portion P2.

As shown in FIG. 1C-1, a peripheral portion P3 of the magnetic layer L3 is exposed by the magnetic layer L4, in accordance with some embodiments. In some embodiments, a width a2 of the peripheral portion P3 is greater than the width b1 of the peripheral portion P2.

As shown in FIG. 1C-1, a peripheral portion P4 of the magnetic layer L4 is exposed by the magnetic layer L5, in accordance with some embodiments. The width a2 of the peripheral portion P3 is greater than a width b2 of the peripheral portion P4, in accordance with some embodiments.

As shown in FIG. 1C-1, a peripheral portion P5 of the magnetic layer L5 is exposed by the magnetic layer L6, in accordance with some embodiments. In some embodiments, a width a3 of the peripheral portion P5 is greater than the width b2 of the peripheral portion P4.

As shown in FIG. 1C-1, a peripheral portion P6 of the magnetic layer L6 is exposed by the magnetic layer L7, in accordance with some embodiments. The width a3 of the peripheral portion P5 is greater than a width b3 of the peripheral portion P6, in accordance with some embodiments.

As shown in FIG. 1C-1, a peripheral portion P7 of the magnetic layer L7 is exposed by the magnetic layer L8, in accordance with some embodiments. In some embodiments, a width a4 of the peripheral portion P7 is greater than the width b3 of the peripheral portion P6.

As shown in FIG. 1C-1, a peripheral portion P8 of the magnetic layer L8 is exposed by the magnetic layer L9, in accordance with some embodiments. The width a4 of the peripheral portion P7 is greater than a width b4 of the peripheral portion P8, in accordance with some embodiments.

As shown in FIG. 1C-1, a peripheral portion P9 of the magnetic layer L9 is exposed by the magnetic layer L10, in accordance with some embodiments. In some embodiments, a width a5 of the peripheral portion P9 is greater than the width b4 of the peripheral portion P8. In some embodiments, each of the widths a1, a2, a3, a4, and a5 is greater than each of the widths b1, b2, b3, and b4.

The degas process may improve the etching resistance of the magnetic layers subsequently formed. Since the degas process is regularly performed during the formation of the magnetic film 190a of FIG. 1A (e.g., the degas process is performed after each two magnetic layers are formed), the magnetic film 190a has a uniform etching resistance, which improves the yield of the etching process of the magnetic film 190a, in accordance with some embodiments.

As a result, the dimension uniformity of the magnetic structure 190 formed by the magnetic film 190a is improved, which improves the adhesion between the magnetic structure 190 and a passivation layer subsequently formed on the magnetic structure 190. Therefore, the reliability and the stability of the electrical performance of the semiconductor device structure with the magnetic structure 190 are improved, in accordance with some embodiments.

FIG. 1C-2 is an enlarged top view of the region R of the semiconductor device structure of FIG. 1C, in accordance with some embodiments. As shown in FIGS. 1C, 1C-1, and 1C-2, the magnetic layers L1, L2, L3, L4, L5, L6, L7, L8, L9, and L10 respectively have sidewalls L1s, L2s, L3s, L4s, L5s, L6s, L7s, L8s, L9s, and L10s, in accordance with some embodiments.

As shown in FIG. 1C-2, the sidewalls L1s, L2s, L3s, L4s, L5s, L6s, L7s, L8s, L9s, and L10s have a straight line-like shape, in accordance with some embodiments. As shown in FIG. 1C-2, the roughness or the deviation of each of the sidewalls L1s, L2s, L3s, L4s, L5s, L6s, L7s, L8s, L9s, and L10s is less than the width a1, b1, a2, b2, a3, b3, a4, b4, or a5 of the peripheral portion P1, P2, P3, P4, P5, P6, P7, P8, or P9 of the magnetic layer L1, L2, L3, L4, L5, L6, L7, L8, or L9, in accordance with some embodiments.

Figure 1D:
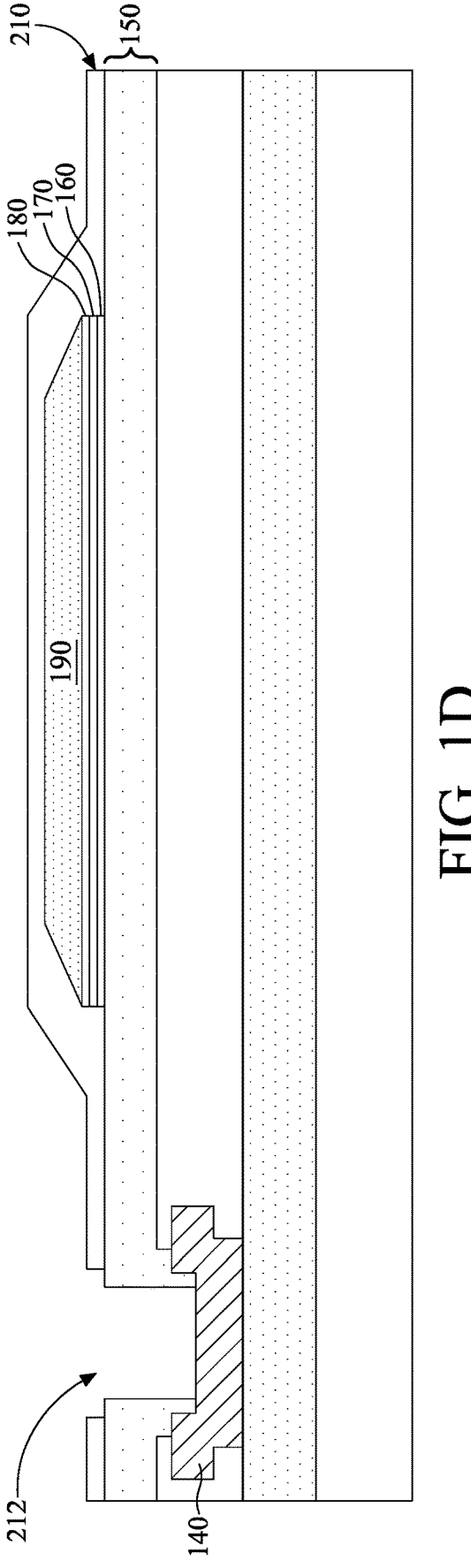

As shown in FIG. 1D, a passivation layer 210 is formed over the passivation layer 150, the adhesive layer 160, the buffer layer 170, the etch stop layer 180, and the magnetic structure 190, in accordance with some embodiments. The passivation layer 210 has an opening 212, in accordance with some embodiments. The opening 212 exposes the central portion of the conductive pad 140, in accordance with some embodiments.

The passivation layer 210 is made of a polymer material, in accordance with some embodiments. The polymer material includes, for example, polyimide, plastic materials, epoxy resin, polyethylene terephthalate (PET), polyvinyl chloride (PVC), polymethylmethacrylate (PMMA), or combinations thereof.

As shown in FIG. 1D, a clean process is performed on the exposed central portion of the conductive pad 140 to remove unwanted residues (not shown) or oxides over the conductive pad 140, in accordance with some embodiments. The removal process includes a plasma process, in accordance with some embodiments. The process gas of the plasma process includes an inert gas, such as Ar, and oxygen gas, in accordance with some embodiments.

Figure 1E:
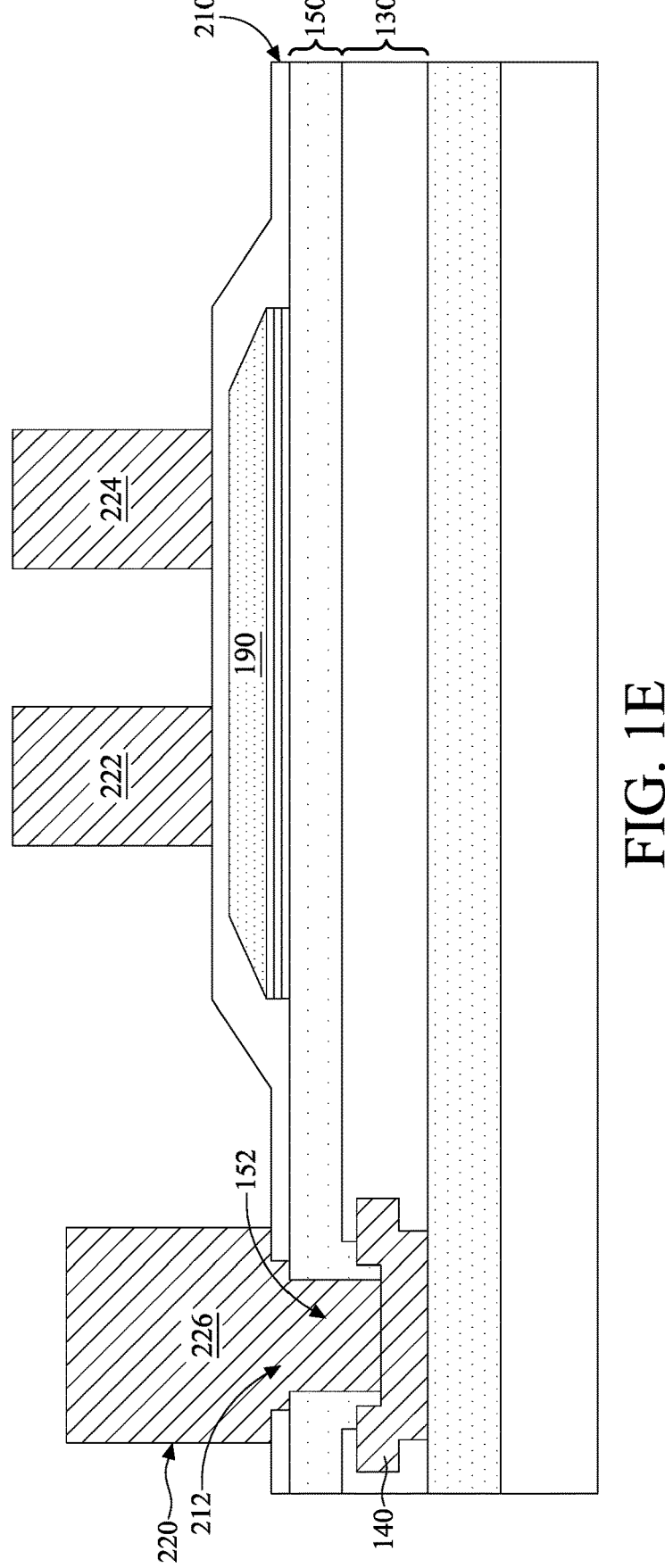

As shown in FIG. 1E, a wiring layer 220 is formed over the passivation layer 210 and the conductive pad 140, in accordance with some embodiments. The wiring layer 220 includes conductive lines 222, 224, and 226, in accordance with some embodiments. The conductive lines 222 and 224 are formed over the passivation layer 210 on the magnetic structure 190, in accordance with some embodiments.

The conductive line 226 is formed in the openings 152 and 212 of the passivation layer 150 and the passivation layer 210 and over the conductive pad 140, in accordance with some embodiments. The conductive line 222 is electrically connected to the conductive line 226, in accordance with some embodiments.

A first current in the conductive line 222 flows in a first direction, and a second current in the conductive line 224 flows in a second direction, which is opposite to the first direction, in accordance with some embodiments. In some embodiments, the first direction includes the direction V1, which points out of the paper, and the second direction includes the direction V2, which points into the paper. In some other embodiments, the first direction includes the direction V2, and the second direction includes the direction V1.

The wiring layer 220 is made of a conductive material, such as metal (e.g., titanium, copper, aluminum, gold, silver, or tungsten) or alloys thereof, in accordance with some embodiments.

Figure 1F:
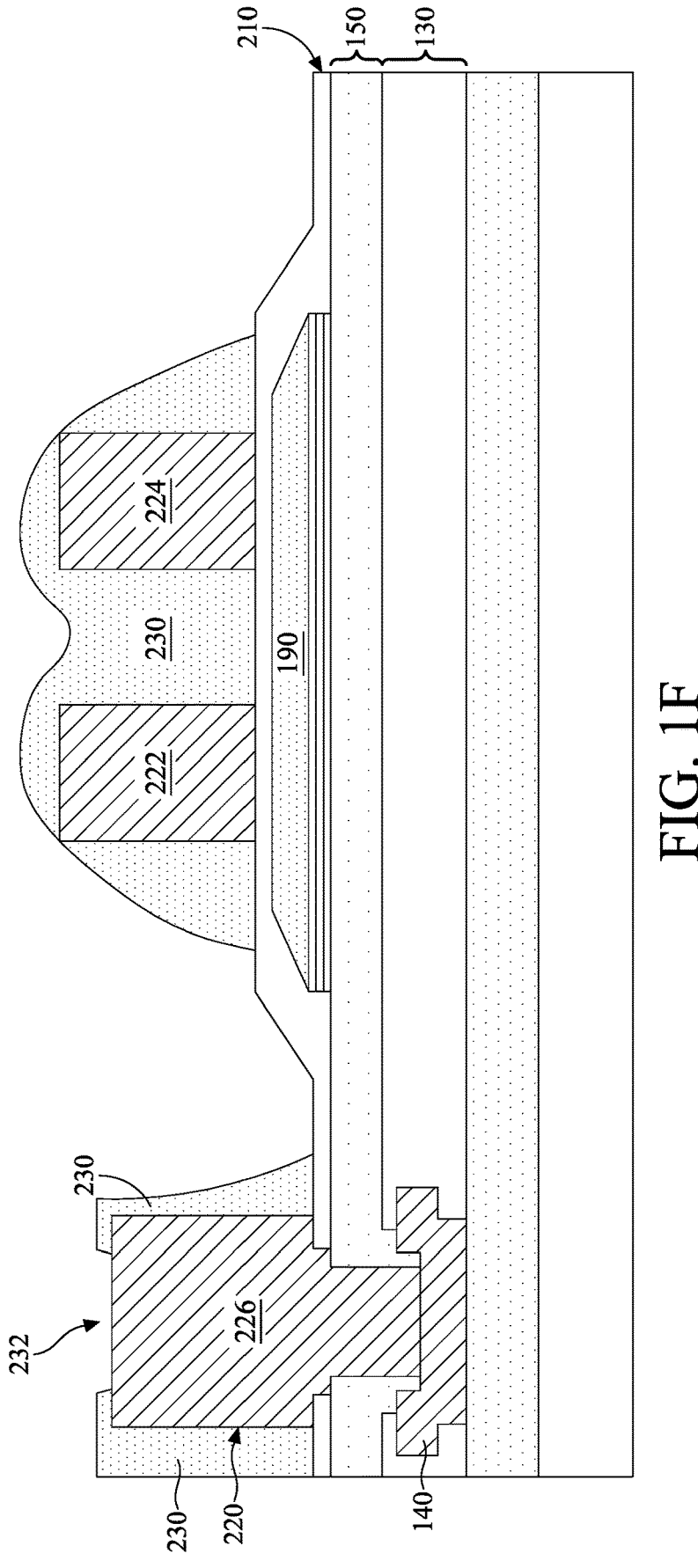

As shown in FIG. 1F, a passivation layer 230 is formed over the wiring layer 220 and the passivation layer 210, in accordance with some embodiments. The passivation layer 230 has an opening 232, in accordance with some embodiments. The opening 232 exposes a portion of the conductive line 226 over the conductive pad 140, in accordance with some embodiments.

The passivation layer 230 is made of a polymer material, in accordance with some embodiments. The polymer material includes, for example, polyimide, plastic materials, epoxy resin, polyethylene terephthalate (PET), polyvinyl chloride (PVC), polymethylmethacrylate (PMMA), or combinations thereof.

Figure 1G:
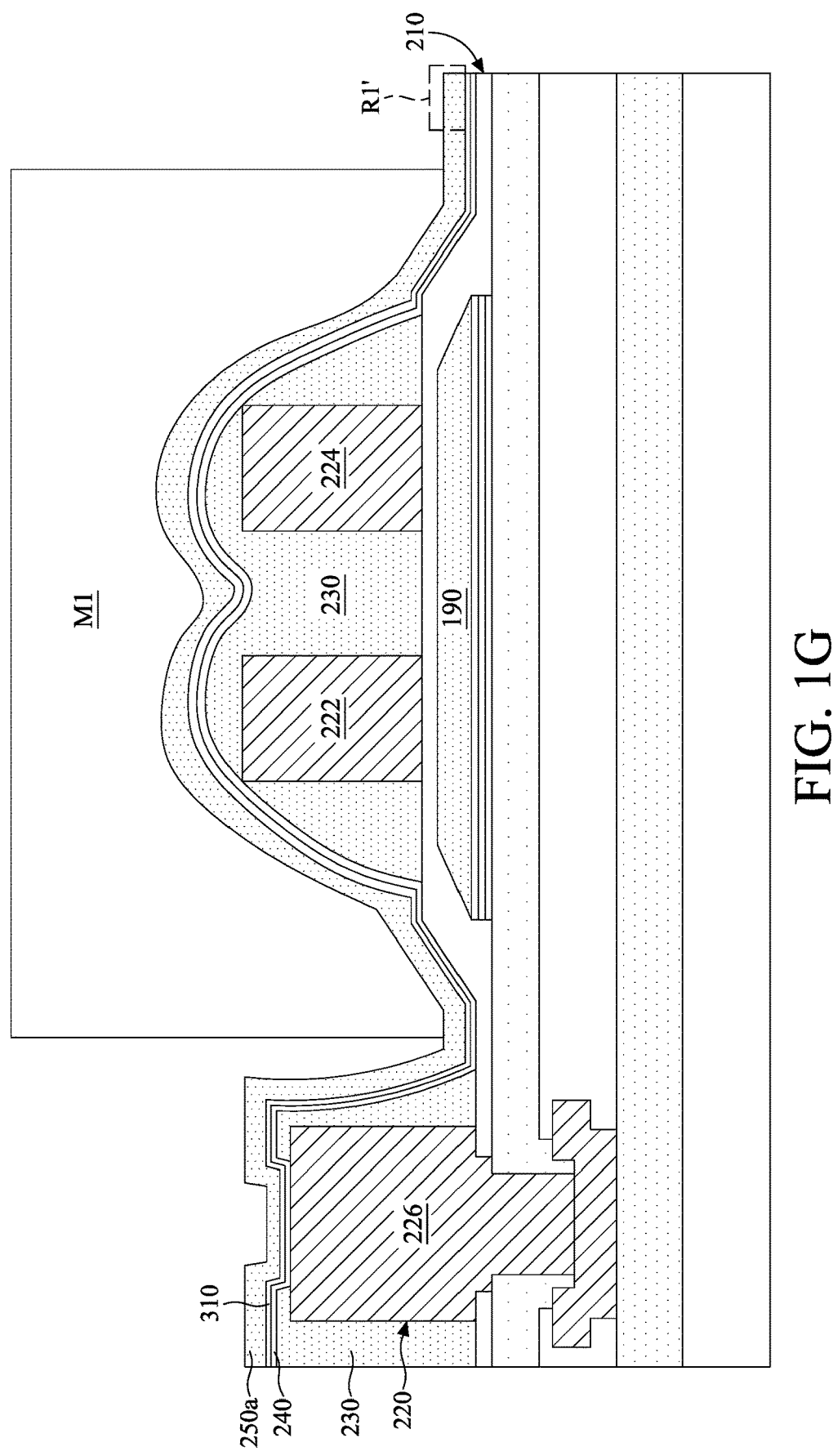
Figures 1, 1G:
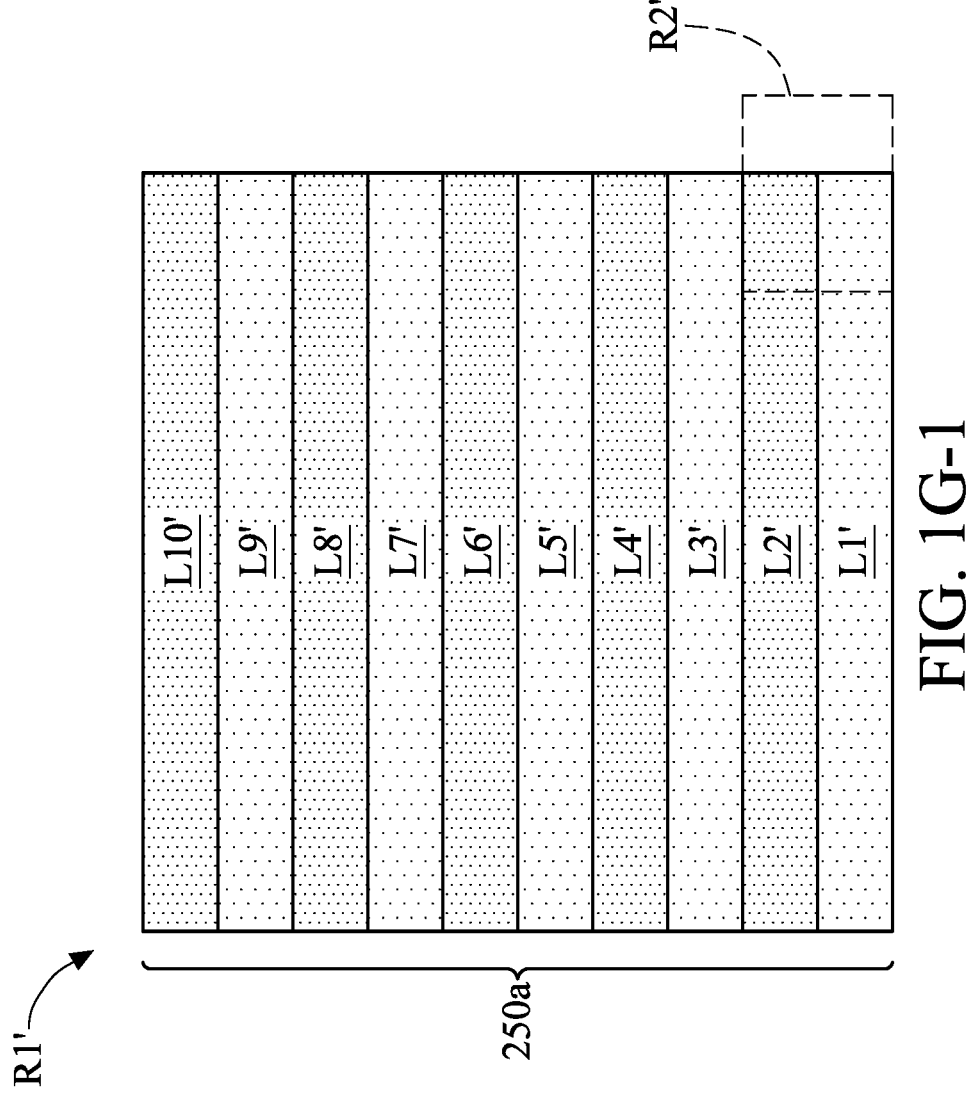
Figures 1, 1G, 2:
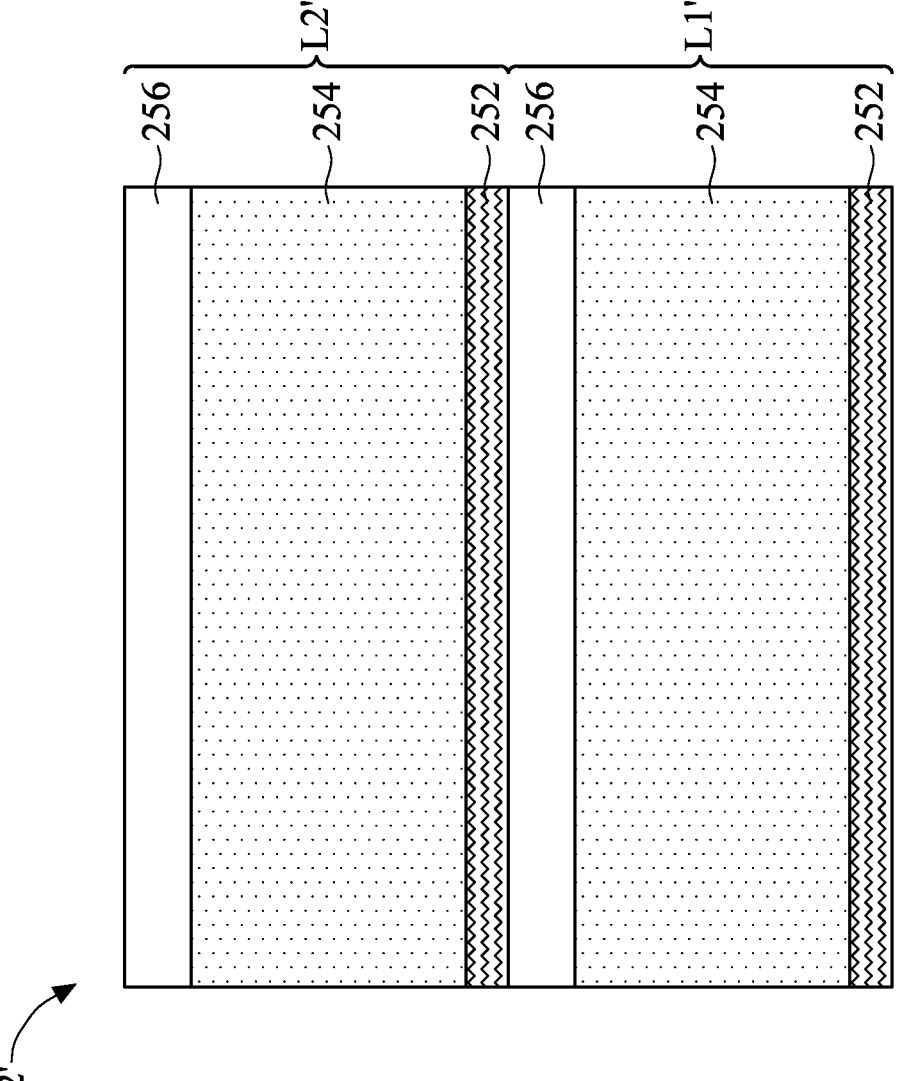

As shown in FIG. 1G, a buffer layer 240 is conformally formed over the passivation layers 210 and 230 and the wiring layer 220, in accordance with some embodiments. The buffer layer 240 is harder than the passivation layer 230, in accordance with some embodiments. The buffer layer 240 is made of a nitride-containing material (e.g., silicon nitride), in accordance with some embodiments.

As shown in FIG. 1G, an etch stop layer 310 is formed over the buffer layer 240, in accordance with some embodiments. The etch stop layer 310 is made of metal and metal oxide such as Ta and TaO, in accordance with some embodiments. The etch stop layer 310 includes metal layers (e.g., Ta layers) and metal oxide layers (e.g., TaO layers) alternatively stacked with each other, in accordance with some embodiments.

As shown in FIG. 1G, a magnetic film 250a is formed over the etch stop layer 310, in accordance with some embodiments. FIG. 1G-1 is an enlarged view of a first region R1' of the semiconductor device structure of FIG. 1G, in accordance with some embodiments.

As shown in FIGS. 1G and 1G-1, the magnetic film 250a includes magnetic layers L1', L2', L3', L4', L5', L6', L7', L8', L9', and L10', in accordance with some embodiments. The magnetic layers L1', L2', L3', L4', L5', L6', L7', L8', L9', and L10' are sequentially stacked over the buffer layer 240, in accordance with some embodiments.

The formation of the magnetic film 250a includes: forming the magnetic layer L1' over the etch stop layer 310; forming the magnetic layer L2' over the magnetic layer L1'; performing a degas process on the magnetic layers L1' and L2'; forming the magnetic layer L3' over the magnetic layer L2'; forming the magnetic layer L4' over the magnetic layer L3'; performing a degas process on the magnetic layers L1', L2', L3', and L4'; forming the magnetic layer L5' over the magnetic layer L4'; forming the magnetic layer L6' over the magnetic layer L5'; performing a degas process on the magnetic layers L1', L2', L3', L4', L5', and L6'; forming the magnetic layer L7' over the magnetic layer L6'; forming the magnetic layer L8' over the magnetic layer L7'; performing a degas process on the magnetic layers L1', L2', L3', L4', L5', L6', L7', and L8'; forming the magnetic layer L9' over the magnetic layer L8'; and forming the magnetic layer L10' over the magnetic layer L9', in accordance with some embodiments.

The degas processes are performed in a vacuum atmosphere under a temperature ranging from about 110 degree C. to about 150 degree C., in accordance with some embodiments. If the temperature is lower than 110 degree C., the degas effect is poor, in accordance with some embodiments. If the temperature is higher than 150 degree C., the devices formed in and/or over the semiconductor substrate 110 are damaged, in accordance with some embodiments.

The magnetic layer L2' is in direct contact with the magnetic layers L1' and L3', in accordance with some embodiments. The magnetic layer L4' is in direct contact with the magnetic layers L3' and L5', in accordance with some embodiments. The magnetic layer L6' is in direct contact with the magnetic layers L5' and L7', in accordance with some embodiments. The magnetic layer L8' is in direct contact with the magnetic layers L7' and L9', in accordance with some embodiments. The magnetic layer L10' is in direct contact with the magnetic layer L9', in accordance with some embodiments.

The magnetic layers L1', L2', L3', L4', L5', L6', L7', L8', L9', and L10' have the same or similar structure, in accordance with some embodiments. FIG. 1G-2 is an enlarged view of a second region R2' of the semiconductor device structure of FIG. 1G-1, in accordance with some embodiments.

As shown in FIGS. 1G-1 and 1G-2, each of the magnetic layers L1', L2', L3', L4', L5', L6', L7', L8', L9', and L10' includes a buffer layer 252, a magnetic material layer 254, and an insulating layer 256, in accordance with some embodiments. For the purpose of simplicity and clarity, FIG. 1G-2 only shows the magnetic layers L1' and L2', in accordance with some embodiments.

In one of the magnetic layers L1', L2', L3', L4', L5', L6', L7', L8', L9', and L10', the magnetic material layer 254 is formed over the buffer layer 252, and the insulating layer 256 is formed over the magnetic material layer 254, in accordance with some embodiments.

The buffer layer 252 is softer than the insulating layer 256, in accordance with some embodiments. The buffer layer 252 is used to prevent the adjacent insulating layer 256 from cracking, in accordance with some embodiments. The insulating layer 256 is used to insulate two adjacent magnetic material layers 254, in accordance with some embodiments.

The formation of each of the magnetic layers L1', L2', L3', L4', L5', L6', L7', L8', L9', and L10' includes: forming the buffer layer 252; forming the magnetic material layer 254 over the buffer layer 252; and forming the insulating layer 256 over the magnetic material layer 254, in accordance with some embodiments.

The buffer layer 252 is made of a material softer than the insulating layer 256, and the material includes metal such as Ta, in accordance with some embodiments. The magnetic material layer 254 is made of a magnetic material such as CoZrTa (CZT), in accordance with some embodiments. The insulating layer 256 is made of an insulating material such as an oxide-containing material (e.g., oxidized CoZrTa (OCZT)), in accordance with some embodiments.

As shown in FIG. 1G, a mask layer M1 is formed over the magnetic film 250a, in accordance with some embodiments. The mask layer M1 is made of a polymer material such as a photoresist material, in accordance with some embodiments.

Figure 1H:
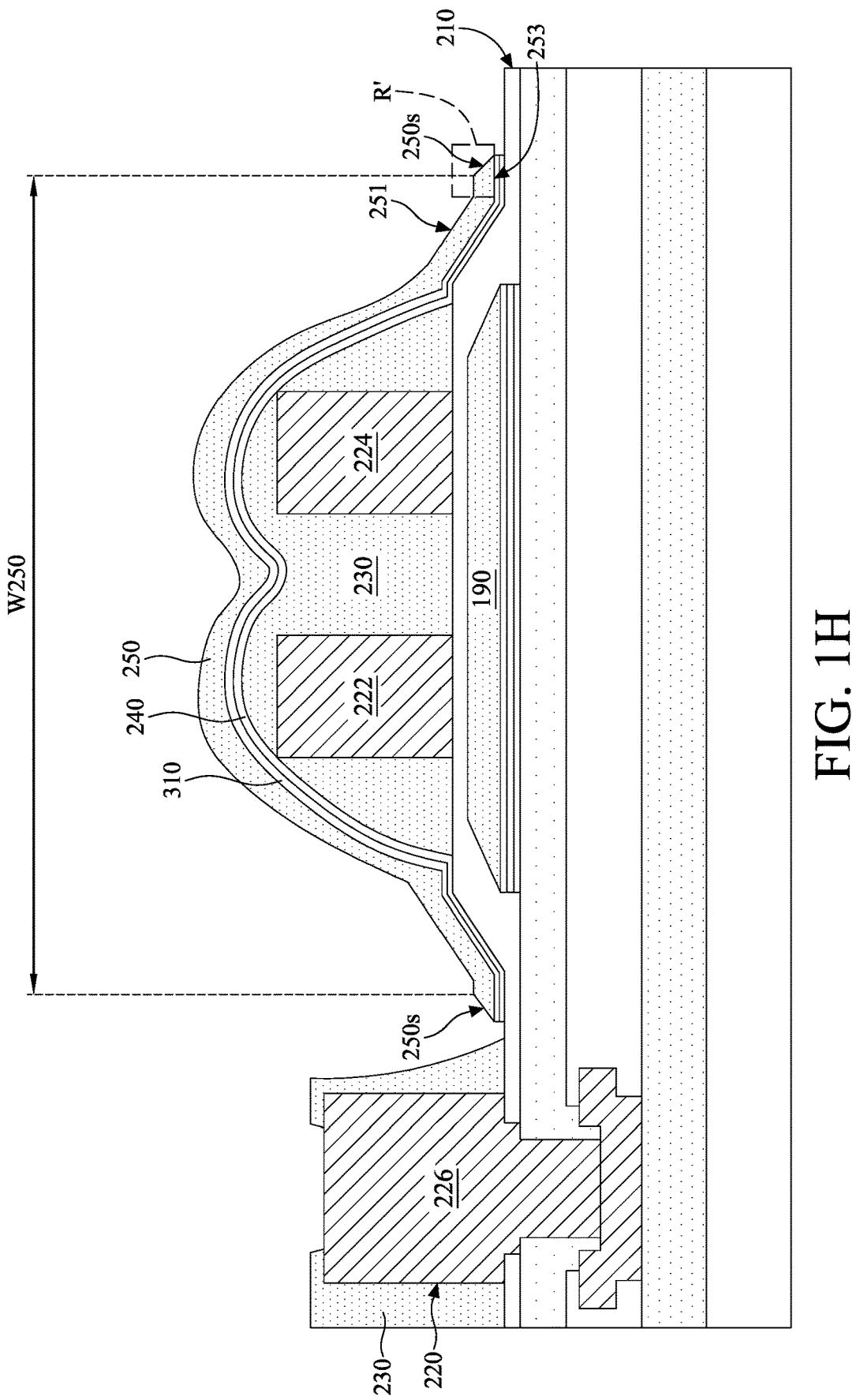
Figures 1, 1H:
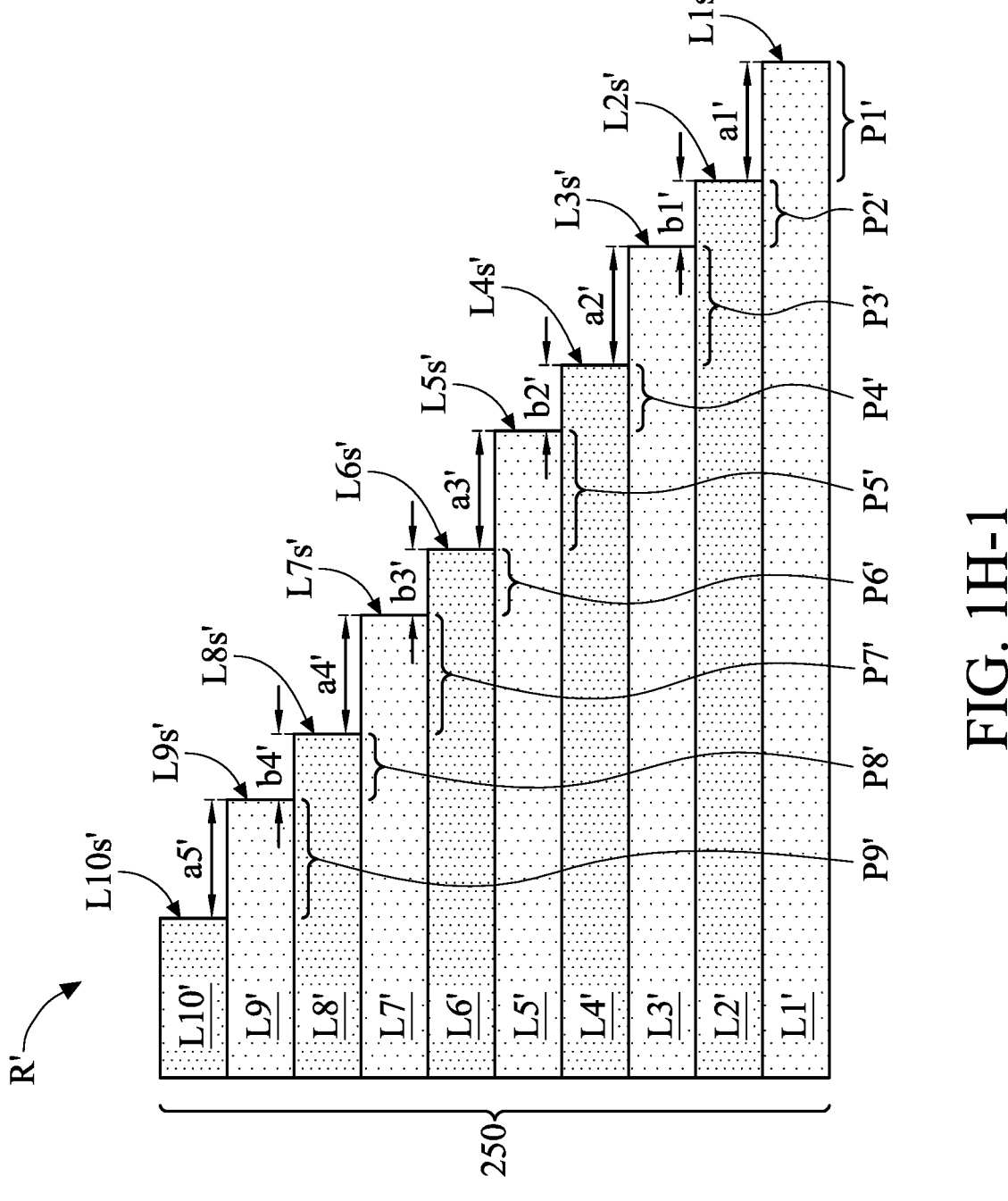
Figures 1, 1H, 2:
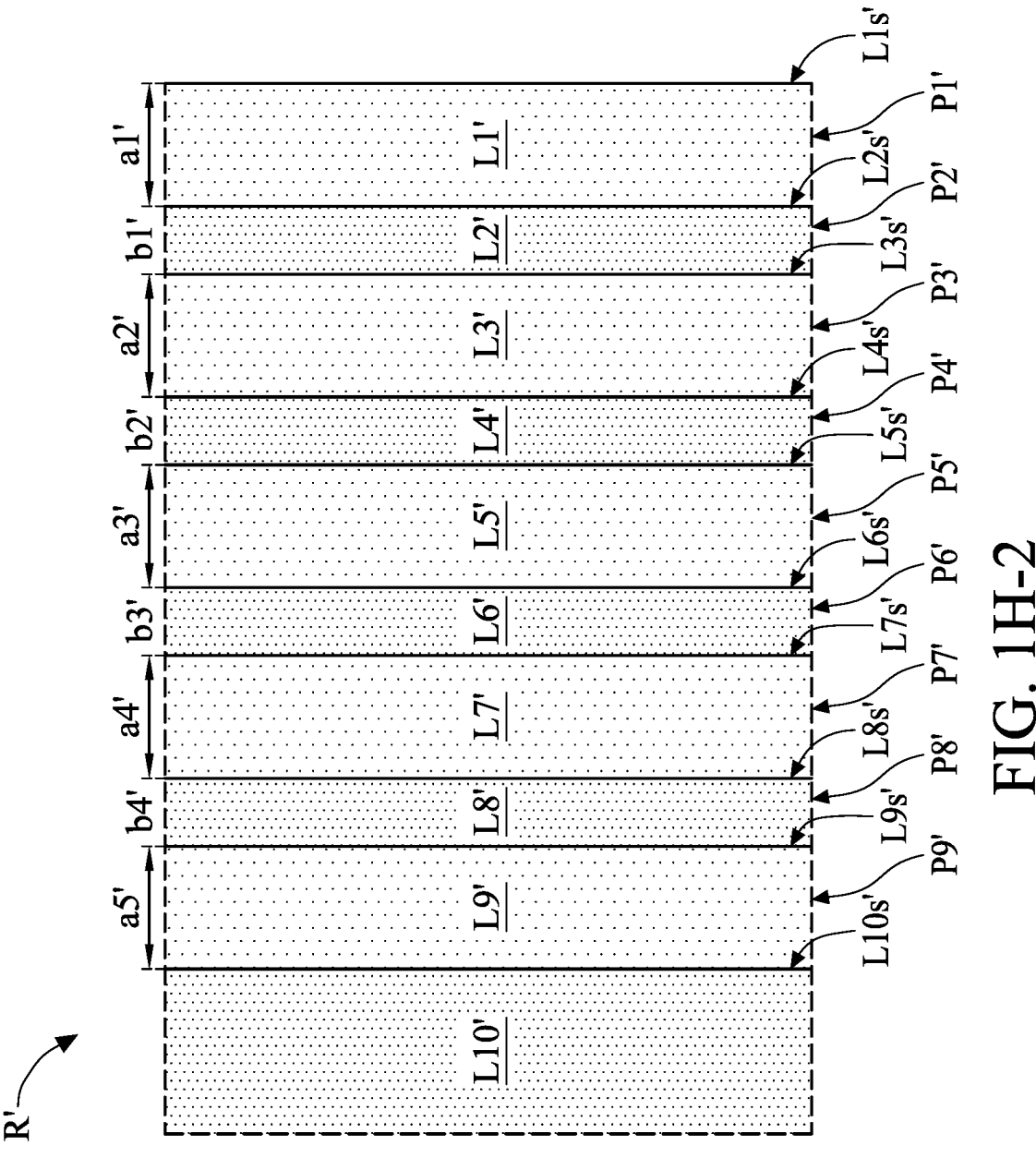

As shown in FIGS. 1G and 1H, portions of the buffer layer 240, the etch stop layer 310, and the magnetic film 250a, which are not covered by the mask layer M1, are removed, in accordance with some embodiments. The remaining magnetic film 250a forms a magnetic structure 250, in accordance with some embodiments. The magnetic structure 250 is wrapped around the conductive lines 222 and 224, in accordance with some embodiments.

The removal process includes an etching process such as a wet etching process and/or a dry etching process, in accordance with some embodiments. The magnetic structure 250 has a top surface 251 and a bottom surface 253, in accordance with some embodiments.

Since the upper portion of the magnetic structure 250 is exposed to the etching process for a relatively longer time than the lower portion of the magnetic structure 250, a width W250 of the magnetic structure 250 gradually increases from the top surface 251 to the bottom surface 253, in accordance with some embodiments.

As shown in FIG. 1H, the mask layer M1 is removed, in accordance with some embodiments. FIG. 1H-1 is an enlarged view of a region R' of the semiconductor device structure of FIG. 1H, in accordance with some embodiments.

As shown in FIGS. 1H and 1H-1, a peripheral portion P1' of the magnetic layer L1' is exposed by the magnetic layer L2', in accordance with some embodiments. As shown in FIG. 1H-1, a peripheral portion P2' of the magnetic layer L2' is exposed by the magnetic layer L3', in accordance with some embodiments. In some embodiments, a width a1' of the peripheral portion P1' is greater than a width b1' of the peripheral portion P2'.

As shown in FIG. 1H-1, a peripheral portion P3' of the magnetic layer L3' is exposed by the magnetic layer L4', in accordance with some embodiments. In some embodiments, a width a2' of the peripheral portion P3' is greater than the width b1' of the peripheral portion P2'.

As shown in FIG. 1H-1, a peripheral portion P4' of the magnetic layer L4' is exposed by the magnetic layer L5', in accordance with some embodiments. The width a2' of the peripheral portion P3' is greater than a width b2' of the peripheral portion P4', in accordance with some embodiments.

As shown in FIG. 1H-1, a peripheral portion P5' of the magnetic layer L5' is exposed by the magnetic layer L6', in accordance with some embodiments. In some embodiments, a width a3' of the peripheral portion P5' is greater than the width b2' of the peripheral portion P4'.

As shown in FIG. 1H-1, a peripheral portion P6' of the magnetic layer L6' is exposed by the magnetic layer L7', in accordance with some embodiments. The width a3' of the peripheral portion P5' is greater than a width b3' of the peripheral portion P6', in accordance with some embodiments.

As shown in FIG. 1H-1, a peripheral portion P7' of the magnetic layer L7' is exposed by the magnetic layer L8', in accordance with some embodiments. In some embodiments, a width a4' of the peripheral portion P7' is greater than the width b3' of the peripheral portion P6'.

As shown in FIG. 1H-1, a peripheral portion P8' of the magnetic layer L8' is exposed by the magnetic layer L9', in accordance with some embodiments. The width a4' of the peripheral portion P7' is greater than a width b4' of the peripheral portion P8', in accordance with some embodiments.

As shown in FIG. 1H-1, a peripheral portion P9' of the magnetic layer L9' is exposed by the magnetic layer L10', in accordance with some embodiments. In some embodiments, a width a5' of the peripheral portion P9' is greater than the width b4' of the peripheral portion P8'. In some embodiments, each of the widths a1', a2', a3', a4', and a5' is greater than each of the widths b1', b2', b3', and b4'.

The degas process may improve the etching resistance of the magnetic layers subsequently formed. Since the degas processes are regularly performed during the formation of the magnetic film 250a of FIG. 1G (e.g., the degas processes are performed after each two magnetic layers are formed), the magnetic film 250a has a uniform etching resistance, which improves the yield of the etching process of the magnetic film 250a, in accordance with some embodiments.

As a result, the dimension uniformity of the magnetic structure 250 formed by the magnetic film 250a is improved, which improves the adhesion between the magnetic structure 250 and a passivation layer subsequently formed on the magnetic structure 250. Therefore, the reliability and the stability of the electrical performance of the semiconductor device structure with the magnetic structure 250 are improved, in accordance with some embodiments.

FIG. 1H-2 is an enlarged top view of the region R' of the semiconductor device structure of FIG. 1H, in accordance with some embodiments. As shown in FIGS. 1H, 1H-1, and 1H-2, the magnetic layers L1', L2', L3', L4', L5', L6', L7', L8', L9', and L10' respectively have sidewalls L1s', L2s', L3s', L4s', L5s', L6s', L7s', L8s', L9s', and L10s', in accordance with some embodiments.

As shown in FIG. 1H-2, the sidewalls L1s', L2s', L3s', L4s', L5s', L6s', L7s', L8s', L9s', and L10s' have a straight line-like shape, in accordance with some embodiments. As shown in FIG. 1H-2, the roughness or the deviation of each of the sidewalls L1s', L2s', L3s', L4s', L5s', L6s', L7s', L8s', L9s', and L10s' is less than the width a1', b1', a2', b2', a3', b3', a4', b4', or a5' of the peripheral portion P1', P2', P3', P4', P5', P6', P7', P8', or P9' of the magnetic layer L1', L2', L3', L4', L5', L6', L7', L8', or L9', in accordance with some embodiments.

Figure 1I:
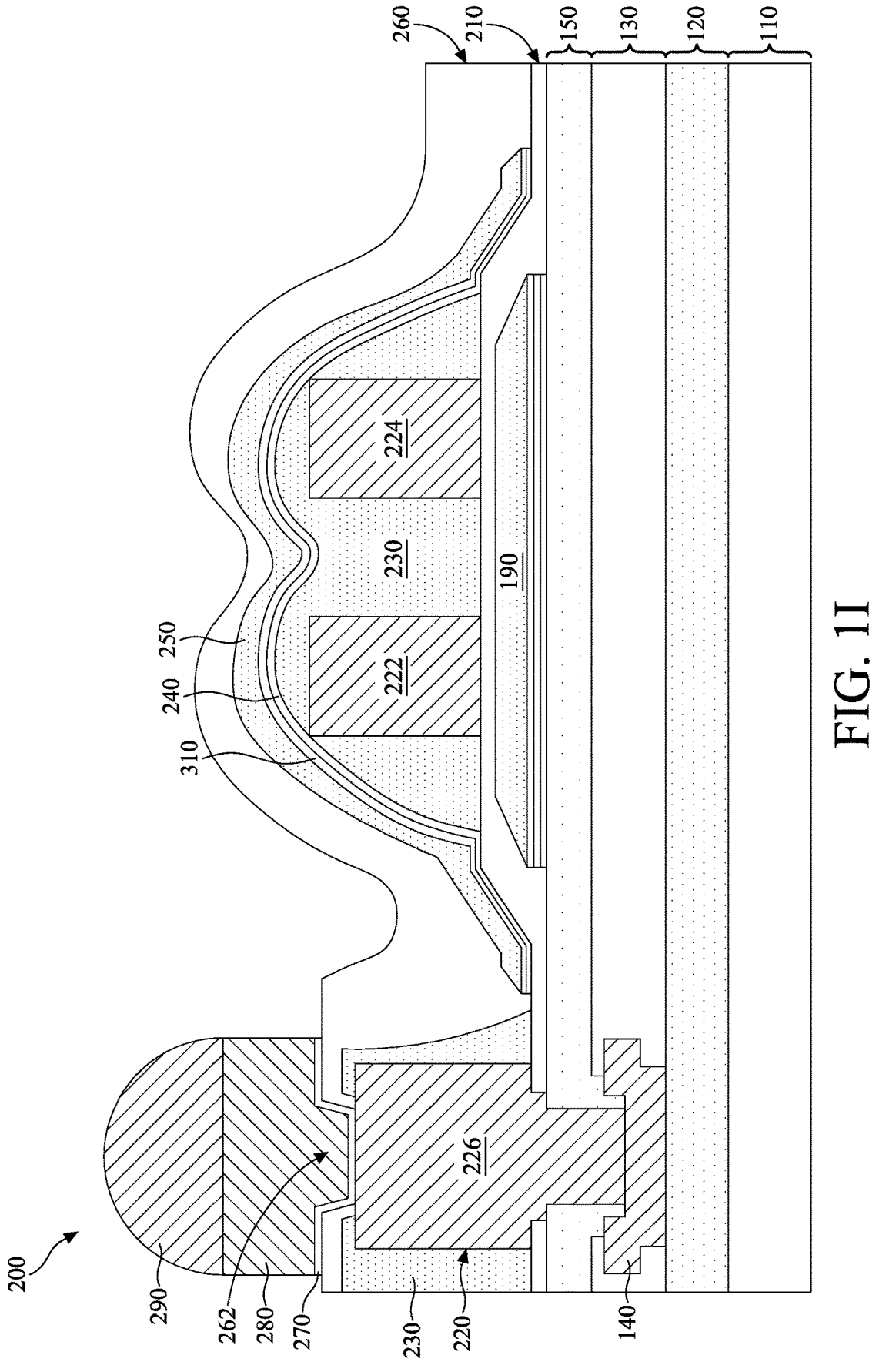

As shown in FIG. 1I, a passivation layer 260 is formed over the passivation layers 210 and 230, the buffer layer 240, the etch stop layer 310, and the magnetic structure 250, in accordance with some embodiments. The passivation layer 260 has an opening 262, in accordance with some embodiments. The opening 262 exposes the portion of the conductive line 226 over the conductive pad 140, in accordance with some embodiments.

The passivation layer 260 is made of a polymer material, in accordance with some embodiments. The polymer material includes, for example, polyimide, plastic materials, epoxy resin, polyethylene terephthalate (PET), polyvinyl chloride (PVC), polymethylmethacrylate (PMMA), or combinations thereof.

As shown in FIG. 1I, a metallurgy layer 270, a conductive bump 280, and a solder bump 290 are sequentially formed over the exposed portion of the conductive line 226, in accordance with some embodiments. The metallurgy layer 270 is also referred to as an under bump metallurgy (UBM) layer, in accordance with some embodiments.

The metallurgy layer 270 is made of a conductive material such as Ti, Cu, Ni, Cr, CrCu, Au, TiW, or a combination thereof, in accordance with some embodiments. The conductive bump 280 is made of a conductive material, such as metal (e.g., copper, titanium, aluminum, gold, silver, or tungsten) or alloys thereof, in accordance with some embodiments. The solder bump 290 is made of a conductive material, such as a tin-based alloy, in accordance with some embodiments.

In this step, a semiconductor device structure 200 is substantially formed, in accordance with some embodiments. The magnetic structures 190 and 250 and the wiring layer 220 together form a rectifier or an (on-chip) inductor, in accordance with some embodiments.

Elements designated by the same or similar reference numbers as those in FIGS. 1A to 1I have the same or similar structures and the materials. Therefore, the detailed descriptions thereof will not be repeated herein.

In accordance with some embodiments, semiconductor device structures and methods for forming the same are provided. The methods (for forming the semiconductor device structure) regularly perform a degas process during the formation of a magnetic film. Therefore, the magnetic film has a uniform etching resistance, which improves the yield of an etching process of the magnetic film. As a result, the dimension uniformity of a magnetic structure formed by the magnetic film is improved, which improves the adhesion between the magnetic structure and a passivation layer formed on the magnetic structure. Therefore, the reliability and the stability of the electrical performance of the semiconductor device structure with the magnetic structure are improved.

In accordance with some embodiments, a method for forming a semiconductor device structure is provided. The method includes providing a substrate. The method includes performing a first degas process on the substrate. The method includes forming a first magnetic layer over the substrate. The method includes forming a second magnetic layer on the first magnetic layer. The method includes performing a second degas process on the substrate, the first magnetic layer, and the second magnetic layer. The method includes forming a third magnetic layer on the second magnetic layer after the second degas process is performed. The method includes partially removing the first magnetic layer, the second magnetic layer, and the third magnetic layer. After the first magnetic layer, the second magnetic layer, and the third magnetic layer are partially removed, a first peripheral portion of the first magnetic layer is exposed by the second magnetic layer, a second peripheral portion of the second magnetic layer is exposed by the third magnetic layer, a first width of the first peripheral portion is greater than a second width of the second peripheral portion, and the first magnetic layer, the second magnetic layer, and the third magnetic layer together form a first magnetic structure.

In accordance with some embodiments, a method for forming a semiconductor device structure is provided. The method includes forming a first magnetic structure over a substrate. The method includes forming a first conductive line and a second conductive line over the first magnetic structure. The method includes forming a first passivation layer over the first conductive line, a second conductive line, and the first magnetic structure. The method includes performing a first degas process on the substrate and the first passivation layer. The method includes forming a first magnetic layer over the first passivation layer. The method includes performing a second degas process on the substrate and the first magnetic layer. The method includes forming a second magnetic layer on the first magnetic layer. The method includes partially removing the first magnetic layer and the second magnetic layer. After the first magnetic layer and the second magnetic layer are partially removed, a first peripheral portion of the first magnetic layer is exposed by the second magnetic layer, and the first magnetic layer and the second magnetic layer together form a second magnetic structure covering the first conductive line, the second conductive line, and the first magnetic structure.

In accordance with some embodiments, a semiconductor device structure is provided. The semiconductor device structure includes a substrate. The semiconductor device structure includes a first magnetic structure over the substrate. The first magnetic structure has a top surface and a bottom surface. A width of the first magnetic structure gradually increases from the top surface to the bottom surface, the first magnetic structure includes a first magnetic layer, a second magnetic layer, a third magnetic layer, a fourth magnetic layer, and a fifth magnetic layer sequentially stacked over the substrate, a first peripheral portion of the first magnetic layer is exposed by the second magnetic layer, a second peripheral portion of the second magnetic layer is exposed by the third magnetic layer, a third peripheral portion of the third magnetic layer is exposed by the fourth magnetic layer, a fourth peripheral portion of the fourth magnetic layer is exposed by the fifth magnetic layer, and each of the first peripheral portion and the third peripheral portion is wider than each of the second peripheral portion and the fourth peripheral portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
providing a substrate;
performing a first degas process on the substrate;
forming a first magnetic layer over the substrate;
forming a second magnetic layer on the first magnetic layer;
performing a second degas process on the substrate, the first magnetic layer, and the second magnetic layer;
forming a third magnetic layer on the second magnetic layer after the second degas process is performed; and
partially removing the first magnetic layer, the second magnetic layer, and the third magnetic layer, wherein after the first magnetic layer, the second magnetic layer, and the third magnetic layer are partially removed, a first peripheral portion of the first magnetic layer is exposed by the second magnetic layer, and a second peripheral portion of the second magnetic layer is exposed by the third magnetic layer.

2. The method for forming the semiconductor device structure as claimed in claim 1, further comprising:
forming a fourth magnetic layer on the third magnetic layer before the first magnetic layer, the second magnetic layer, and the third magnetic layer are partially removed, wherein the partially removing of the first magnetic layer, the second magnetic layer, and the third magnetic layer further comprises:
partially removing the fourth magnetic layer, wherein a third peripheral portion of the third magnetic layer is exposed by the fourth magnetic layer after the fourth magnetic layer is partially removed, and a third width of the third peripheral portion is greater than the second width of the second peripheral portion.

3. The method for forming the semiconductor device structure as claimed in claim 2, further comprising:
performing a third degas process on the substrate, the first magnetic layer, the second magnetic layer, the third magnetic layer, and the fourth magnetic layer.

4. The method for forming the semiconductor device structure as claimed in claim 3, further comprising:
forming a fifth magnetic layer on the fourth magnetic layer after the third degas process is performed and before the first magnetic layer, the second magnetic layer, the third magnetic layer, and the fourth magnetic layer are partially removed, wherein the partially removing of the first magnetic layer, the second magnetic layer, and the third magnetic layer further comprises:
partially removing the fifth magnetic layer, wherein a fourth peripheral portion of the fourth magnetic layer is exposed by the fifth magnetic layer after the fifth magnetic layer is partially removed, and the third width of the third peripheral portion is greater than a fourth width of the fourth peripheral portion.

5. The method for forming the semiconductor device structure as claimed in claim 1, wherein the first magnetic layer comprises a magnetic material layer and an insulating layer over the magnetic material layer.

6. The method for forming the semiconductor device structure as claimed in claim 5, wherein the first magnetic layer further comprises a buffer layer, the magnetic material layer is over the buffer layer, and the buffer layer is softer than the insulating layer.

7. The method for forming the semiconductor device structure as claimed in claim 1, wherein the first magnetic layer, the second magnetic layer, and the third magnetic layer together form a first magnetic structure, and the method further comprises:

forming a first conductive line and a second conductive line over the first magnetic structure; and forming a second magnetic structure over the first conductive line, a second conductive line, and the first magnetic structure.

8. The method for forming the semiconductor device structure as claimed in claim 7, further comprising:

forming a passivation layer over the first conductive line, the second conductive line, and the first magnetic structure before the second magnetic structure is formed, wherein the second magnetic structure is formed over the passivation layer.

9. The method for forming the semiconductor device structure as claimed in claim 1, wherein the first degas process is performed in a vacuum atmosphere under a temperature ranging from about 110 degree C. to about 150 degree C.

10. The method for forming the semiconductor device structure as claimed in claim 1, wherein a first width of the first peripheral portion is greater than a second width of the second peripheral portion.

11. A method for forming a semiconductor device structure, comprising:

forming a first magnetic structure over a substrate;

forming a first conductive line and a second conductive line over the first magnetic structure;

forming a first passivation layer over the first conductive line, the second conductive line, and the first magnetic structure;

performing a first degas process on the substrate and the first passivation layer;

forming a first magnetic layer over the first passivation layer;

performing a second degas process on the substrate and the first magnetic layer;

forming a second magnetic layer over the first magnetic layer; and partially removing the first magnetic layer and the second magnetic layer, wherein after the first magnetic layer and the second magnetic layer are partially removed, a first peripheral portion of the first magnetic layer is exposed by the second magnetic layer, and the first magnetic layer and the second magnetic layer together form a second magnetic structure covering the first conductive line, the second conductive line, and the first magnetic structure.

12. The method for forming the semiconductor device structure as claimed in claim 11, further comprising:

performing a third degas process on the substrate, the first magnetic layer, and the second magnetic layer before the first magnetic layer and the second magnetic layer are partially removed;

forming a third magnetic layer on the second magnetic layer after the third degas process is performed, wherein the partially removing of the first magnetic layer and the second magnetic layer further comprises:

partially removing the third magnetic layer, wherein a second peripheral portion of the second magnetic layer is exposed by the third magnetic layer after the third magnetic layer is partially removed.

13. The method for forming the semiconductor device structure as claimed in claim 11, further comprising:

forming a buffer layer over the first passivation layer before the first degas process is performed, wherein the first magnetic layer is formed over the buffer layer, and the buffer layer is softer than the first magnetic layer.

14. The method for forming the semiconductor device structure as claimed in claim 11, further comprising:

forming a second passivation layer over the second magnetic structure.

15. The method for forming the semiconductor device structure as claimed in claim 11, wherein the second magnetic structure is wrapped around the first conductive line and the second conductive line.

16. A semiconductor device structure, comprising:

a substrate; and a first magnetic structure over the substrate, wherein the first magnetic structure has a top surface and a bottom surface, a width of the first magnetic structure gradually increases from the top surface to the bottom surface, the first magnetic structure comprises a first magnetic layer, a second magnetic layer, a third magnetic layer, a fourth magnetic layer, and a fifth magnetic layer sequentially stacked over the substrate, a first peripheral portion of the first magnetic layer is exposed by the second magnetic layer, a second peripheral portion of the second magnetic layer is exposed by the third magnetic layer, a third peripheral portion of the third magnetic layer is exposed by the fourth magnetic layer, a fourth peripheral portion of the fourth magnetic layer is exposed by the fifth magnetic layer, and each of the first peripheral portion and the third peripheral portion is wider than each of the second peripheral portion and the fourth peripheral portion.

17. The semiconductor device structure as claimed in claim 16, further comprising:

a first conductive line and a second conductive line over the first magnetic structure; and a second magnetic structure over the first conductive line, a second conductive line, and the first magnetic structure.

18. The semiconductor device structure as claimed in claim 17, further comprising:

a passivation layer covering the first conductive line, the second conductive line, and the first magnetic structure, wherein the second magnetic structure is over the passivation layer.

19. The semiconductor device structure as claimed in claim 16, further comprising:

a second magnetic structure between the first magnetic structure and the substrate; and a first conductive line and a second conductive line between the first magnetic structure and the second magnetic structure.

20. The semiconductor device structure as claimed in claim 19, wherein the first magnetic structure is wrapped around the first conductive line and the second conductive line.

\* \* \* \* \*